(12) United States Patent
Lazar

(10) Patent No.: US 6,757,207 B1
(45) Date of Patent: Jun. 29, 2004

(54) REFRESH MISS DETECT CIRCUIT FOR SELF-REFRESHING DRAM

(75) Inventor: Paul S. Lazar, Santa Clara, CA (US)

(73) Assignee: Nanoamp Solutions, Inc., San Jose, CA (US)

( * ) Notice: Subject to any disclaimer, the term of this patent is extended or adjusted under 35 U.S.C. 154(b) by 0 days.

(21) Appl. No.: 10/270,473

(22) Filed: Oct. 11, 2002

(51) Int. Cl.[7] .................................................. G11C 7/00
(52) U.S. Cl. .................. 365/222; 365/230.08; 365/236; 365/189.08; 365/201
(58) Field of Search ............................ 365/222, 230.08, 365/189.08, 236, 233, 201

(56) References Cited

U.S. PATENT DOCUMENTS 6,260,149 B1 * 7/2001 Baweja ........................ 713/300

* cited by examiner

Primary Examiner—Andrew Q. Tran
(74) Attorney, Agent, or Firm—Patrick T. King

(57) ABSTRACT

A counter is incremented whenever an internal refresh is requested and a prior internal refresh request has not yet been completed. A refresh-request storage element such as a latch circuit, provides an output signal that is set upon receipt of an internal refresh request control signal to initiate an internal refresh cycle. A refresh-request storage element is reset upon initiation of an internal refresh cycle. A refresh miss detector provides an output pulse when the refresh request signal is received concurrent with the refresh request storage element being set. Provision is made to read out the count, and to reset the count. By reading out the count an indication is obtained of how many refresh requests were missed, and by using arbitrary input patterns the robustness of the self-refreshing DRAM is improved.

19 Claims, 1 Drawing Sheet

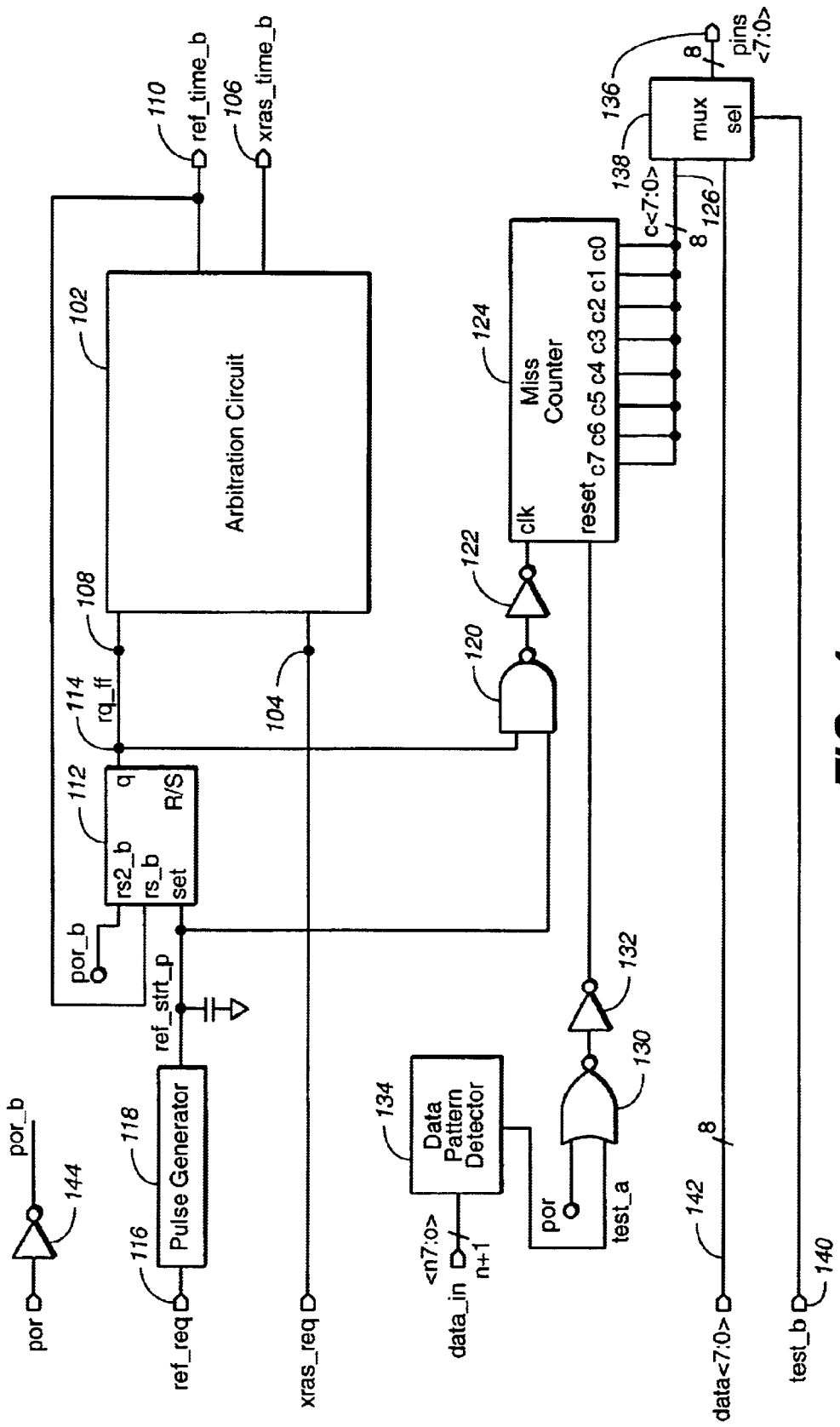
FIG._1

REFRESH MISS DETECT CIRCUIT FOR SELF-REFRESHING DRAM

BACKGROUND OF THE INVENTION

1. Field of the Invention

This invention relates to self-refreshing DRAMs and, more particularly, to a test mode circuit that tests for missed internal refresh cycles.

2. Prior Art

A self-refreshing DRAM uses dynamic RAM memory cells which must be periodically refreshed. If a DRAM cell is not refreshed within a certain period of time, memory cells lose their charge and may provide erroneous data when read. Previously, it was not possible to test or to characterize a self-refresh DRAM with regard to its ability to ensure that all refresh cycles were properly executed. Consequently, a need exists for a technique to test or characterize a self-refresh DRAM with regard to its ability to ensure that all refresh cycles were properly executed.

SUMMARY OF THE INVENTION

In order to be able to test or characterize a self-refreshing dram to ensure that refresh cycles are properly executed, it is advantageous to incorporate a circuit that indicates if any attempts at an internal refresh have failed to execute.

It is therefore an object of the invention to provide a counter, which is incremented whenever an internal refresh is requested and a prior internal refresh request has not yet been completed. Provision is made to read out the count, and to reset the count. By reading out the count an indication is obtained of how many refresh requests were missed, and by using arbitrary input patterns the robustness of the self-refresh circuitry can be tested and confirmed.

A latch or similar storage element is set whenever an internal refresh cycle is requested. The latch is reset when a refresh cycle begins execution. If an internal refresh request occurs and the latch is still set, the counter is incremented to indicate a missed internal refresh cycle. Circuitry is also provided which allows the counter to be cleared, for example, upon application of a suitable test mode pattern.

The present invention provides a circuit for detecting missed refresh cycles of a self-refreshing DRAM. The circuit includes a refresh-request storage element that has an output terminal at which is provided an output signal that is set upon receipt of an internal refresh request control signal to initiate an internal refresh cycle. The output of the storage element is reset upon initiation of an internal refresh cycle. IN one preferred embodiment, the storage element is a latch circuit such an R/S flip-flop circuit.

The circuit for detecting missed refresh cycles includes a refresh miss detector that provides an output pulse when the refresh request signal is received concurrent with the refresh request storage element being set.

The circuit for detecting missed refresh cycles also includes a refresh miss counter that is incremented with an output pulse of the refresh miss detector and that accumulates a count of missed refresh cycles.

The output terminal of the refresh-request storage element is connected to one input terminal of an arbitration circuit. Another input terminal of the arbitration circuit receives an external row-access-select (xras_req) signal. The output terminal of the arbitration circuit provides either a refresh cycle activation signal (ref_time_b) or an external row-access-select (xras_time_b) signal. The refresh cycle activation signal (ref_time_b) resets the refresh-request storage element.

The invention further provides a two-bus input multiplexer having an output terminals that are connected to data output terminals of the self-refreshing DRAM. The multiplexer has one set of input terminals that are connected to respective "bit" output terminal of the counter. The multiplexer has another set of input terminals that are connected to data <7:0> out put signals of the DRAM.

The refresh miss detector includes a two-input AND circuit that has a first input terminal coupled to the ref_req input terminal and a second input terminal coupled to the output terminal of the storage element such that the AND circuit provides an output signal when a refresh_req signal is received and the storage element is set. The refresh miss counter is reset by a signal that is provided when a suitable test mode pattern is provided to data input terminals of the self refreshing DRAM.

A data pattern detector detects when a suitable test mode pattern is provided to data input terminals of the self refreshing DRAM and provides a reset signal to reset the refresh miss counter.

The present invention also provides a method for testing for refresh misses in a self-refreshing DRAM. The method includes the steps of setting an output terminal of a storage device upon receipt of an internal refresh request control signal that is intended to initiate an internal refresh cycle; normally resetting the output terminal of the storage device upon initiation of the internal refresh cycle; detecting that an internal refresh cycle has not occurred and providing a refresh-missed output pulse indicative thereof; and incrementing a refresh miss counter with the refresh-missed pulses to accumulate a count of missed internal refresh cycles.

The step of detecting that an internal refresh cycle has not occurred includes detecting that a refresh request signal is received concurrent with the refresh request storage element being set.

The step of normally resetting the output terminal of the storage device upon initiation of the internal refresh cycle includes the steps of: arbitrating between an internal refresh request signal and an external request signal; and providing a refresh cycle activation signal to reset the storage device.

The method includes the step of connecting signals representative of the accumulated count of missed internal refresh cycles to output pins of the DRAM.

The step of detecting that an internal refresh cycle has not occurred includes logically combining in an AND function a refresh request signal and a concurrent set status of the storage device.

BRIEF DESCRIPTION OF THE DRAWING

The accompanying drawing, which is incorporated in and form a part of this specification, illustrates an embodiment of the invention and, together with the description, serve to explain the principles of the invention:

FIG. 1 is a circuit diagram of a circuit for detecting refresh misses for a self-refreshing DRAM according to the invention.

DETAILED DESCRIPTION OF THE PREFERRED EMBODIMENT

Reference is now made in detail to one preferred embodiment of the invention, an example of which is illustrated in the accompanying drawings. While the invention is described in conjunction with the preferred embodiment, it will be understood that it is not intended to limit the invention to this embodiment. On the contrary, the invention is intended to cover alternatives, modifications and equivalents, which may be included within the spirit and scope of the invention as defined by the appended claims.

A latch or similar storage element is set whenever an internal refresh cycle is requested. The latch is initially cleared at power on reset. The latch is reset whenever a refresh cycle begins execution. If a refresh request occurs and the latch is still set, a miss counter is incremented to record the number of miss internal refresh execution cycles.

FIG. 1 shows a circuit 100 that detects and reports missed refresh cycles for a self-refreshing DRAM. The self-refreshing DRAM is provided with an arbitration circuit 102 that arbitrates between two input request signals. One input request signal xras_req is a request for an external data input/output cycle for the DRAM. This request signal is provided at an arbitration input terminal 104. If the request is granted, the arbitration circuit 102 provides a xras_time_b control signal at an output terminal 106. The xras_time_b output control signal is active LOW and initiates an external read or write cycle for a designated row of the DRAM.

The other input request signal rq_ff to the arbitration circuit 102 is for an internal refresh cycle. This internal refresh request signal rq_ff is provided at an input terminal 108 of the arbitration circuit 102. If the request for an internal refresh cycle is granted, the arbitration circuit 102 provides a ref_time_b output control signal at an output terminal 110. The ref_time_b output control signal is an active LOW signal that initiates and times an internal refresh cycle of a designated row of the DRAM.

The arbitration circuit 102 determines which request input signal has priority and generates an appropriate output signal to initiate either an internal refresh cycle ref_time_b control signal or an external read/write cycle xras_time_b control signal.

For an internal refresh request, a RS flip-flop storage element 112 functions as a storage element or a latch and provides the rq_ff output signal at an output terminal 114 which is connected to the input terminal 108 of the arbitration circuit 102.

An active HIGH refresh request input signal ref req is provided at an input terminal 116 that is connected to an input terminal of a pulse generator 118. The pulse generator 118 is triggered on a positive-going edge of the refresh request input signal ref_req to provide a refresh start pulse ref_strt_p to a set input terminal of the RS flip-flop circuit 112.

A first reset input terminal of the RS flip-flop circuit 112 receives the ref_time_b input signal that is fed back from the output terminal 110 of the arbitration circuit 102. A second reset input terminal of the RS flip-flop circuit 112 receives a an inverted power-on reset signal por-b. The q output terminal of the RS flip-flop circuit 112 provides the output signal rq_ff that is applied to the input terminal 108 of the arbitration circuit 102.

The refresh request signal ref_req is asserted periodically to generates ref_strt_p pulses which set the RS latch 112. When a refresh cycle begins execution, the ref_time_b is asserted LOW and resets the RS latch 112. If the refresh is not executed prior to the next refresh request signal, a refresh cycle has been missed.

FIG. 1 shows a refresh miss detector circuit that provides an output pulse when a refresh request signal is received concurrent with the refresh request RS flip-flop storage element 112 being set. The refresh miss detector is provided by a logical AND function that is provided by a 2-input NAND gate 120 and an inverter 122. The two-input AND function has a first input terminal coupled to the refresh request input signal ref_req through the pulse generator circuit 118. A second input terminal of the AND function is coupled to the output terminal of the RS flip-flop latch storage element 112 such that the AND function provides an output signal when a refresh_req signal is received and the storage element 112 is set to a HIGH level.

When the logical AND circuit generates a HIGH output signal, the HIGH output signal serves as a clock pulse that is fed to a clock input terminal of a multi-bit counter 124. The counter 124 is incremented by the clock pulses, one for each missed internal refresh cycle so that the counter 124 accumulates a multi-bit count for the missed internal refresh cycles. The output bits of the counter c0–c7 are proved on a multi-line counter output bus 126. Eight bits are illustrated in FIG. 1 and any number of bits can be provided as required.

An OR function is provided by a 2-input NOR gate 130 and an inverter 132 in series with the output of the NOR gate. An output terminal of the inverter 132 is connected to a reset input terminal of the counter 124. One input terminal of the 2-input NOR gate 130 receives a power-on reset signal por. The other input terminal of the 2-input NOR gate 130 receives a counter reset signal test_a from a data pattern detector 134. The counter 124 is initially cleared or reset with the power-on reset signal por. Provision is also made to clear the counter 124 by means of a test mode control signal test_a that is provided, for example, when a suitable test-mode pattern of data signals data_in <7:0> is provided.

The output bit signals of the counter 124 on the bus 126 are delivered to the output pins of the DRAM device, collectively indicated by 136 by means of a two-bus input multiplexer 138. A test mode control signal test_b provided at a terminal 140 selectively switches the multiplexer to alternatively deliver the counter output signal on the multi-line bus 126 to the output pins 136. In a normal mode of operation of the DRAM, the multiplexer 138 passes internal data signals data (7:0) provided on a bus 142 to the output pins 136. The test_a and test_b are generated to implement testing of the DRAM. The power-on-reset signal is inverted in an inverter 144 to provide an inverted power-on-reset signal por_b.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the Claims appended hereto and their equivalents.

I claim:

1. A circuit for detecting missed refresh cycles of a self-refreshing DRAM comprising:

a refresh-request storage element has an output terminal at which is provided an output signal that is set upon receipt of an internal refresh request signal to initiate an internal refresh cycle and that is reset upon initiation of the internal refresh cycle;

a refresh miss detector coupled to the refresh-request storage element, that provides an output pulse when the refresh request signal is received concurrent with the refresh request storage element being set; and a refresh miss counter that is incremented by the output pulse of the refresh miss detector and that accumulates a count of missed refresh cycles, said output pulse being generated when the refresh request signal is received concurrent with the refresh request storage element being set.

2. The circuit of claim 1:

wherein the output terminal of the refresh-request storage element is connected to one input terminal of an arbitration circuit and wherein another input terminal of the arbitration circuit receives an external row-access-select (xras_req) signal;

wherein an output terminal of the arbitration circuit provides either a refresh cycle activation signal (ref_time_b) or an internal row-access-select (xras_time_b) signal; and wherein the refresh cycle activation signal (ref_time_b) resets the refresh-request storage element.

3. The circuit of claim 1 including a two-bus input multiplexer having output terminals that are connected to data output terminals of the self-refreshing DRAM;

wherein the multiplexer has one set of input terminals that are connected to respective "bit" output terminal of the counter; and wherein the multiplexer has another set of input terminals that are connected to data <7:0> output signals of the DRAM.

4. The circuit of claim 1 wherein the storage element is a latch circuit.

5. The circuit of claim 4 wherein the latch circuit is an R/S flip-flop circuit.

6. The circuit of claim 1 wherein the refresh miss detector includes a two-input AND circuit that has a first input terminal coupled to a ref_req input terminal and a second input terminal coupled to the output terminal of the storage element such that the AND circuit provides an output signal when a ref_req signal is received and the storage element is set.

7. The circuit of claim 1 wherein the refresh miss counter is reset by a signal that is provided when a suitable test mode pattern is provided to data input terminals of the self refreshing DRAM.

8. The circuit of claim 7 including a data pattern detector that detects when the suitable test mode pattern is provided to data input terminals of the self refreshing DRAM and that provides a reset signal to reset the refresh miss counter.

9. A circuit for detecting missed refresh cycles of a self-refreshing DRAM, comprising:

a refresh-request storage element has an output terminal at which is provided an output signal that is set upon receipt of an internal refresh request signal to initiate an internal refresh cycle and that is reset upon initiation of the internal refresh cycle;

a refresh miss detector coupled to the refresh-request storage element, that provides an output pulse when the refresh request signal is received concurrent with the refresh request storage element being set;

a refresh miss counter that is incremented by the output pulse of the refresh miss detector and that accumulates a count of missed refresh cycles, said output pulse being generated when the refresh request signal is received concurrent with the refresh request storage element being set; and an arbitration circuit having one input terminal connected to the output terminal of the refresh-request storage element and having another input terminal receiving an external row-access-select (xras_req) signal;

wherein an output terminal of the arbitration circuit provides either a refresh cycle activation signal (ref_time_b) or an internal row-access-select (xras_time_b) signal; and wherein the refresh cycle activation signal (ref_time_b) resets the refresh-request storage element.

10. The circuit of claim 9 wherein the storage element is a latch circuit.

11. The circuit of claim 9 wherein the latch circuit is an R/S flip-flop circuit.

12. The circuit of claim 9 wherein the refresh miss detector includes a two-input AND circuit that has a first input terminal coupled to a ref_req input terminal and a second input terminal coupled to the output terminal of the storage element such that the AND circuit provides an output signal when a refresh_req_signal is received and the storage element is set.

13. The circuit of claim 9 including a two-bus input multiplexer having output terminals that are connected to data output terminals of the self-refreshing DRAM;

wherein the multiplexer has one set of input terminals that are connected to respective "bit" output terminal of the counter; and wherein the multiplexer has another set of input terminals that are connected to data <7:0> out put signals of the DRAM.

14. The circuit of claim 9 wherein the refresh miss counter is reset by a signal that is provided when a suitable test mode pattern is provided to data input terminals of the self refreshing DRAM.

15. A method for testing for refresh misses in a self-refreshing DRAM, comprising the steps of:

setting an output terminal of a storage device upon receipt of an internal refresh request signal that is intended to initiate an internal refresh cycle;

normally resetting the output terminal of the storage device upon initiation of the internal refresh cycle;

detecting that an internal refresh cycle has not occurred and providing a refresh-missed output pulse indicative thereof; and incrementing a refresh miss counter with the refresh-missed pulses to accumulate a count of missed internal refresh cycles.

16. The method of claim 15 wherein the step of detecting that an internal refresh cycle has not occurred includes detecting that a refresh request signal is received concurrent with the storage device being set.

17. The method of claim 15 wherein the step of normally resetting the output terminal of the storage device upon initiation of the internal refresh cycle includes the steps of:

arbitrating between the internal refresh request signal and an external request signal; and providing a refresh cycle activation signal to reset the storage device.

18. The method of claim 15 including the step of connecting signals representative of the accumulated count of missed internal refresh cycles to output pins of the DRAM.

19. The method of claim 15 wherein the step of detecting that an internal refresh cycle has not occurred includes logically combining in an AND function the internal refresh request signal and a concurrent set status of the storage device.

* * * * *